(12) United States Patent
Wu et al.

(10) Patent No.: US 10,176,995 B1
(45) Date of Patent: Jan. 8, 2019

(54) METHODS, APPARATUS AND SYSTEM FOR GATE CUT PROCESS USING A STRESS MATERIAL IN A FINFET DEVICE

(71) Applicant: GLOBALFOUNDRIES INC., Grand Cayman (KY)

(72) Inventors: Xusheng Wu, Ballston Lake, NY (US); Haigou Huang, Rexford, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/673,232

(22) Filed: Aug. 9, 2017

(51) Int. Cl.
| | |
|---|---|
| H01L 21/8238 | (2006.01) |
| H01L 21/265 | (2006.01) |
| H01L 21/8234 | (2006.01) |
| H01L 21/02 | (2006.01) |
| H01L 21/768 | (2006.01) |
| H01L 21/84 | (2006.01) |
| H01L 21/28 | (2006.01) |
| H01L 29/66 | (2006.01) |

(52) U.S. Cl.
CPC .. *H01L 21/26566* (2013.01); *H01L 21/02274* (2013.01); *H01L 21/28088* (2013.01); *H01L 21/76829* (2013.01); *H01L 21/823431* (2013.01); *H01L 21/823835* (2013.01); *H01L 21/845* (2013.01); *H01L 29/66795* (2013.01)

(58) Field of Classification Search
None
See application file for complete search history.

(56) References Cited

U.S. PATENT DOCUMENTS

| | | | | |
|---|---|---|---|---|
| 9,805,983 | B1 * | 10/2017 | Cheng | H01L 21/823475 |
| 9,853,028 | B1 * | 12/2017 | Cheng | H01L 27/0886 |
| 9,911,736 | B1 * | 3/2018 | Zang | H01L 27/0886 |
| 2018/0108770 | A1 * | 4/2018 | Cheng | H01L 29/785 |

* cited by examiner

*Primary Examiner* — Thien F Tran
(74) *Attorney, Agent, or Firm* — Williams Morgan, P.C.

(57) ABSTRACT

At least one method, apparatus and system disclosed herein involves a gate cut process using a stress material for a finFET device. A set of fins are formed on a semiconductor substrate. A gate region is formed above a portion of the set of fins. A gate cut trench is formed within the gate region. A dielectric material comprising an intrinsic stress is deposited into the gate cut region. A replacement metal gate process is performed in the gate region. Residue metal features are removed about the gate cut region.

20 Claims, 11 Drawing Sheets

METHODS, APPARATUS AND SYSTEM FOR GATE CUT PROCESS USING A STRESS MATERIAL IN A FINFET DEVICE

BACKGROUND OF THE INVENTION

Field of the Invention

Generally, the present disclosure relates to the manufacture of sophisticated semiconductor devices, and more specifically, to various methods for a gate cut process for a FinFET device.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element.

FIG. 1 illustrates a stylized cross-sectional depiction of a state-of-the-art finFET device. A finFET device 100 illustrated in FIG. 1 comprises a plurality of "fins" 110. The source and drain of the finFET are placed horizontally along the fin. A high-k metal gate 120 wraps over the fin, covering it on three sides. The gate 120 defines the length of the finFET device. As dimensions in finFET devices become smaller, performing state-of-the-art gate cut processes subsequent to forming trench silicide contact features may result in residue on the edges of the gate cut regions, which may result in device operations problems.

FIGS. 2 and 3 illustrate stylized cross-sectional depictions of typical gate cut and etch process results with respect to a finFET device. Turning now to FIG. 2, a device 200 comprises a substrate layer 210 on which a plurality of fins 230 are formed. Further, a shallow trench isolation (STI) layer 240 is formed, and the exposed portions of the fins 230 above the STI layer 240 is lined with an oxide liner 235.

In the gate region, as shown in FIG. 2, dummy gate regions 260 having a gate cut region 250 are formed. In order to protect the gate region during trench silicide (TS) formation processes, the gate cut region 250 is filled with dielectric material, forming an dielectric layer 255. After performing a TS formation process, the dielectric layer 255 is removed and a replacement metal gate (RMG) process is performed. FIG. 3 shows the result of removing the dielectric layer 255. FIG. 3 shows a void in the gate cut region 250 after the removal of the dielectric layer 255.

A reactive ion etching (RIE) for removing work function metals and/or tungsten material are performed. In some cases, this may result in metal residue 350 at the edges of the voids in the gate cut region 250. The metal residue 350 is often referred to as gate cut "stringers."

Due to the stringers/metal residue 350, despite the usage of a gate hard mask, full protection-coverage of the gate region may not be achieved, which may result in a current leakage path. In some cases, the stringers/metal residue 350 may behave as an undesirable conduction channel, which allows for electron flow, and may result in an electrical short between the gate and a source/drain region. These problems may case device performance problems and/or increased defects during device manufacturing, negatively affecting manufacturing yields.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system involving a gate cut process using a stress material for a finFET device. A set of fins are formed on a semiconductor substrate. A gate region is formed above a portion of the set of fins. A gate cut trench is formed within the gate region. A dielectric material comprising an intrinsic stress is deposited into the gate cut region. A replacement metal gate process is performed in the gate region. Residue metal features are removed about the gate cut region.

BRIEF DESCRIPTION OF THE DRAWINGS

The disclosure may be understood by reference to the following description taken in conjunction with the accompanying drawings, in which like reference numerals identify like elements, and in which.

Figure 1:
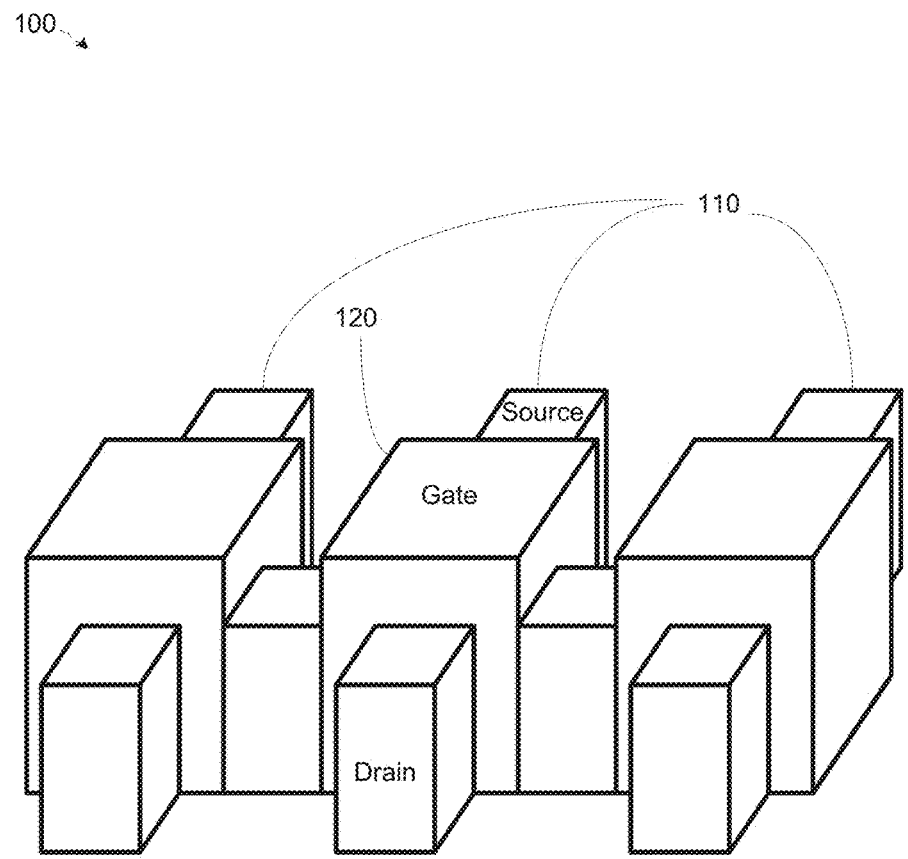
FIG. 1 illustrates a stylized cross-sectional depiction of a state-of-the-art finFET device prior to performing a gate cut process.
Figure 2:
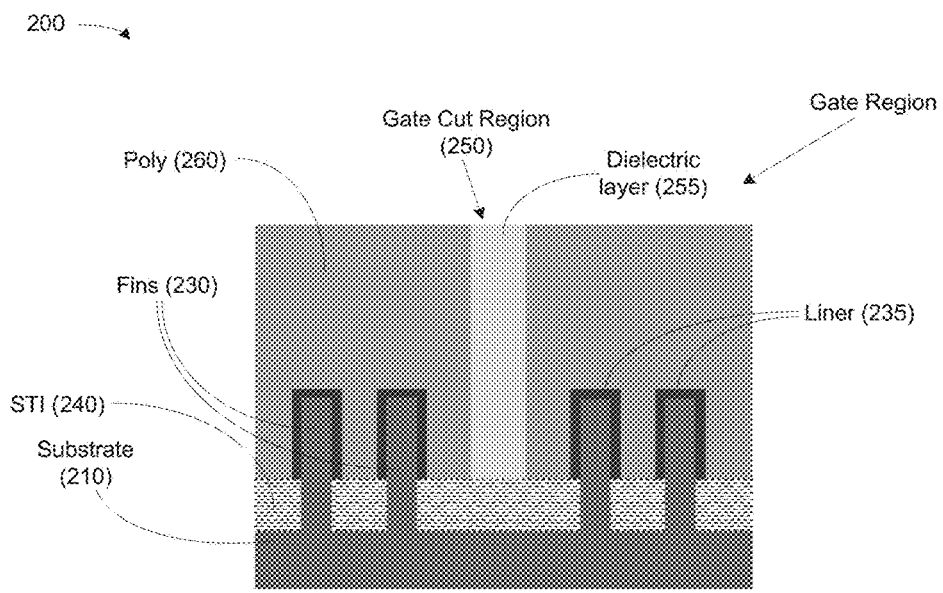
FIG. 2 illustrates a stylized cross-sectional depiction of a state-of-the-art finFET device with regard to a gate cut material deposition process.
Figure 3:
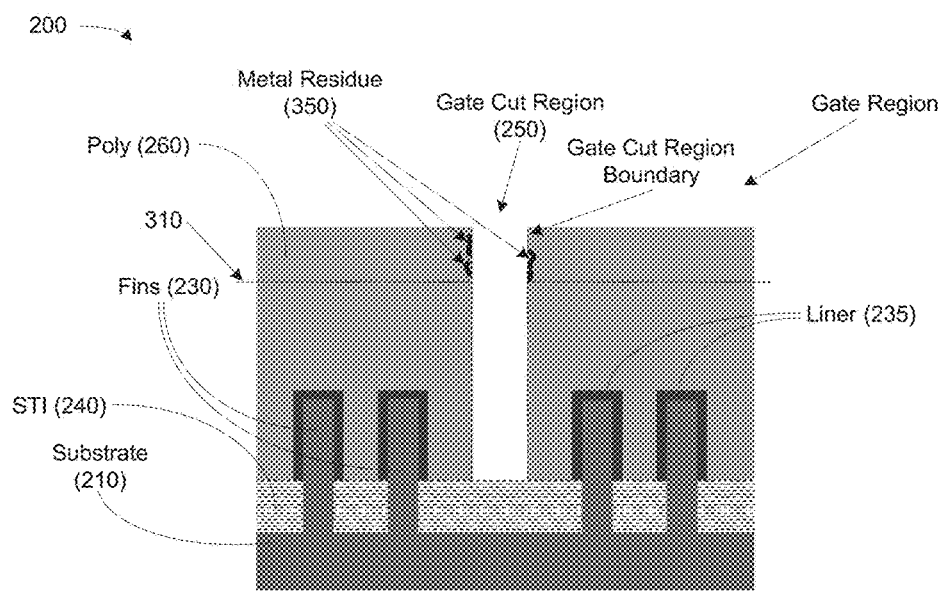
FIG. 3 illustrates a stylized cross-sectional depiction of a state-of-the-art finFET device with regard to removing a gate cut material.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. Objects depicted in the drawings are not drawn to scale.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached Figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for utilizing a stress-inducing material in a gate cut region for providing a reduction or substantial elimination of metal residue subsequent to etch processes in and proximate to the gate cut region. For example, after TS formation and RMG processes are performed, an RIE process may be performed to form a gate cut region, i.e., a gate cut trench in a gate portion of the finFET. As a result of the usage of stress materials provided by embodiments herein, a shape-expansion at a top portion of the gate cut regions may be formed, providing for a more efficient etch process and a reduction of metal residue. In this manner, embodiments herein provide for a reduction in the formation of undesirable channel effect, thereby reducing the probability of electrical short between a gate and a source/drain (S/D) region.

Figure 4:
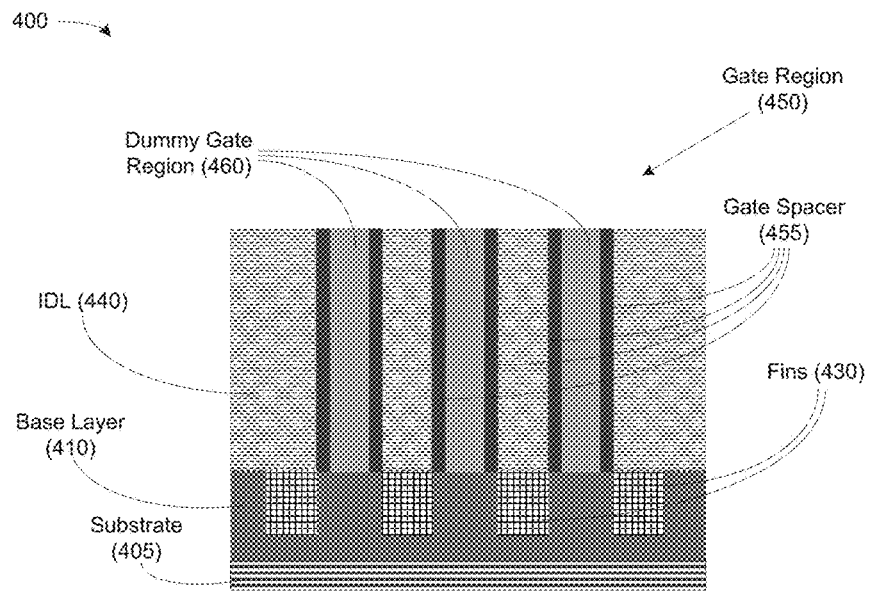
FIG. 4 illustrates a cross-sectional view of a finFET device with respect to a gate region comprising a material having intrinsic stress, in accordance with embodiments herein.

Turning now to FIG. 4, a cross-sectional view of a finFET device with respect to a gate region comprising a material having intrinsic stress, in accordance with embodiments herein, is illustrated. A device 400 comprises a substrate layer 405 (e.g., silicon substrate, silicon germanium substrate, etc.) on which a base layer 410 may be formed. Using one of various techniques, a plurality of fins 430 are formed on the base layer 410. Each of the fins 430 may be part of a fin structure, which may include the fin 430 and a plurality of layers of materials that may be deposited on the fins 430. Some of the fins 430 may be PFET fins, while others may be NFET fins.

In a gate region 450, as shown in FIG. 4, poly gate (dummy gate) regions 460 are formed between gate liners 455. The gate liners 455 are surrounded by an inter-dielectric layer (IDL) 440. The gate liner 455 material may comprise silicon dioxide, silicon nitride, and/or a combination thereof. The dummy gate regions 460 may be filled with dummy (poly) gate material, such as carbide (BC), a silicon boron carbide material that contains nitrogen (i.e., SiB:C(N)), carbon (C), and or SiO2.

In some embodiments, the ILD layers 440 of FIG. 4 may comprise intrinsic stress. In one embodiment, the stress may be compressive stress, while in other embodiments, the stress may be tensile stress. Due to the presence of the poly gate material 460 between the gate spacers, the stress from the ILD layers 440 is substantially balanced. Removing the poly gate material 460 would provide a desirable imbalance from the stress. As such, the effects of this imbalance may be used to control the shape of the top portion of the gate area, which may be helpful in reducing the metal residue described above. The amount of stress in the ILD layer 440, and thereby the imbalance, may be controlled to affect the shape of the top portion of the gate area.

Figure 5:
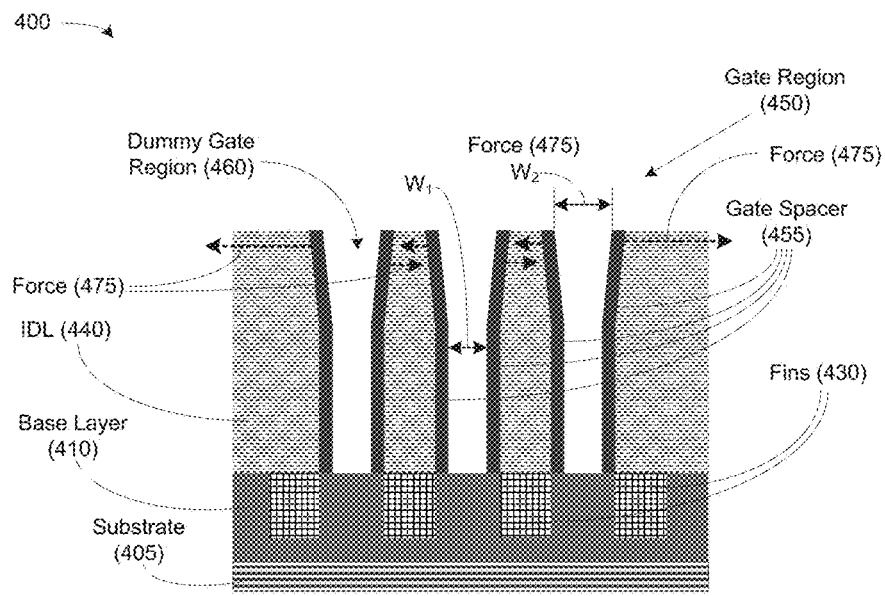
FIG. 5 illustrates a cross-sectional view of a finFET device with respect to removal of dummy gate material, in accordance with embodiments herein.

FIG. 5 illustrates a cross-sectional view of a finFET device with respect to removal of dummy gate material, in accordance with embodiments herein. A poly-pull process known to those skilled in the art may be performed in order to implement an RMG process. Upon performing a poly-pull process, the stress-counteraction provided by the poly gate material 460 is removed. As such, the top portion of the gate region 450 may open up in the manner shown in FIG. 5. This provides a force acting on the gate regions 450 as depicted by the dotted lines 475. The bottom portion of the gate region 450 may have a first width ($W_1$), while the top portion of the gate region 450 may be have a second width ($W_2$), wherein $W_1$ is less than $W_2$.

In some embodiments, the amount of intrinsic stress in the ILD layers 440 may be controlled such that a desirable, predetermined amount of difference between $W_1$ and $W_2$ is achieved. That is, a predetermined amount of opening at the top portion of the gate regions 450 is provided by controlling the amount of intrinsic stress provided by the ILD layer 440. The amount of difference between $W_1$ and $W_2$ is determined to provide a gate RIE result to reduce or substantially eliminate residue material and stringers at the boundary of the ILD layer 440 and the gate regions 440, as well as reduce the amount of boundary-induced stringers. In some embodiments, modeling and/or simulations may be performed by process design modules to provide appropriate date to process control systems (described later) to provide a predetermined amount of opening at the top portions of the gate regions 450 to provide improved reduction of material residue and/or stringers.

FIGS. 6-16 illustrate stylized cross-sectional depictions of finFET devices under manufacture, in accordance with various embodiments herein. The cross-sectional depictions of FIGS. 6-16 are perpendicular views of the finFET device relative to the views of FIGS. 4-5.

Figure 6:
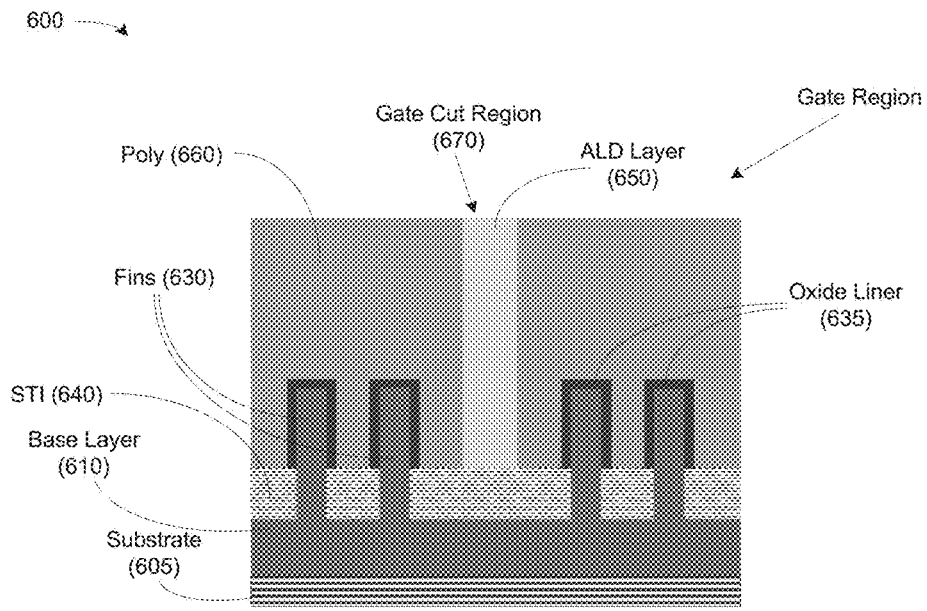
FIG. 6 illustrates a stylized cross-sectional depiction of finFET device with respect to depositing a stress ALD material into a gate cut region, in accordance with a first embodiment.

Turning now to FIG. 6, a stylized cross-sectional depiction of finFET device with respect to depositing a stress ALD material into a gate cut region, in accordance with a first embodiment, is illustrated. A device 600 comprises a substrate layer 605 (e.g., silicon substrate, silicon germanium substrate, etc.) on which a base layer 610 is formed. In some embodiment, the substrate layer 605 and the base layer 610 may be a single layer. Using one of various techniques known to those skilled in the art, a plurality of fins 630 are formed on the base layer 610. Each of the fins 630 may be part of a fin structure, which may include the fin 630 and a plurality of layers of materials that may be deposited on the fins 630.

An STI layer 640 may be formed over the base layer 605, up to a predetermined height of the fins 630. The exposed portions of the fins 630 above the STI layer 640 are lined with an oxide liner 635. Some of the fins 630 may be PFET fins, while others may be NFET fins.

As shown in FIG. 6, poly gate regions 660 are formed over the fins 630 by depositing a dummy poly gate material, e.g., polysilicon material. In a predetermined location, a gate cut region 670 is formed between portions of the poly gate region 660. For example, a trench or void may be formed in the poly gate region 660 for forming the gate cut region. In order to protect the gate region during trench silicide (TS) formation processes, the gate cut region 670 may be filled with an atomic layer deposition (ALD) nitride material, e.g., $SiNi_2$, forming an ALD layer 650.

In a first embodiment, the ALD layer 650 comprises an intrinsic stress. In one embodiment, the stress may be greater than 10 MP. In one embodiment, the stress may be compressive stress, while in other embodiments, the stress may be tensile stress. A chemical-mechanical polishing (CMP) process may be performed to smooth out the poly gate layer 660 and the ALD layer 650 and bring them to a predetermined height.

Due to the presence of the poly gate material 660, the stress from the ALD layer 650 is substantially balanced. Removing the poly gate material 660 would provide a desirable imbalance from the stress. Therefore, this imbalance may be controlled, providing control over the shape of the top portion of the gate area, which may be helpful in reducing the metal residue described herein.

Figure 7:
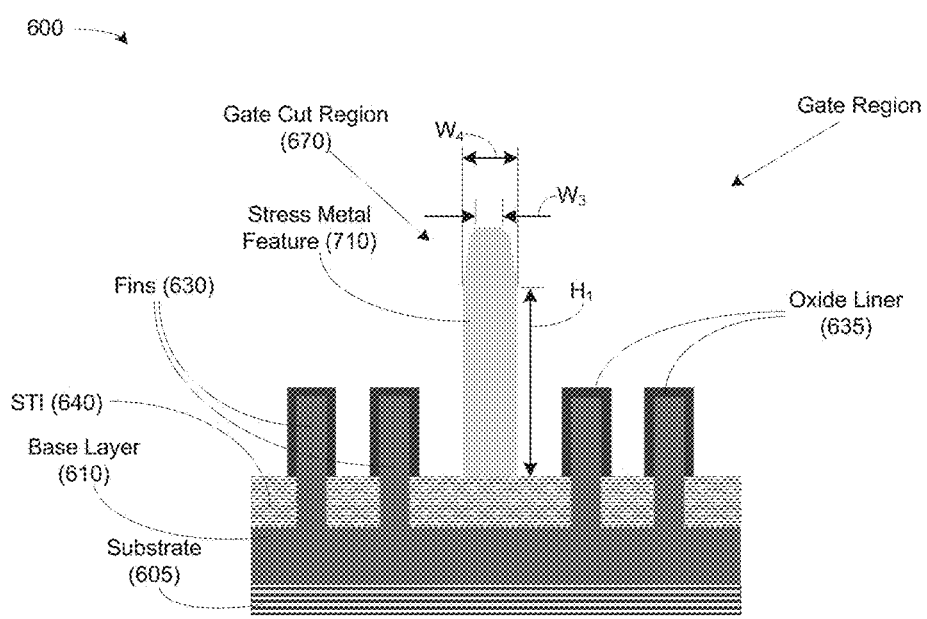
FIG. 7 illustrates a stylized cross-sectional depiction of finFET device with respect to a poly pull process, in accordance with a first embodiment.

Turning now to FIG. 7, a stylized cross-sectional depiction of finFET device with respect to a poly pull process, in accordance with a first embodiment, is illustrated. After performing TS formation processes, the ALD material 660 is removed from the gate regions. A poly pull process is performed to remove the poly gate material from the poly gate portion 640, as known to those skilled in the art. This leaves voids in the former locations of the poly gate portions 640 and also leaves a stress material feature 710.

Subsequent to performing the poly pull process, the intrinsic stress of the material in the ALD layer 650 may cause a shape change in the manner shown in FIG. 7. As the balance of stress provided by the ALD layer 650 is disturbed due to the poly pull process, the stress material feature 710 experiences a net stress. As a result of this stress imbalance, the width of the top portions of the stress material feature 710 may become progressively narrower as compared to a lower portion of the stress material feature 710. The difference between the width ($W_3$) at a lower portion (at height, $H_1$) of the stress material feature 710 may be greater than the width ($W_4$) at the top portion of the ALD layer 650. In one embodiment, the width of the stress material feature 710 may change from $W_3$ to $W_4$ in a linear fashion from the height, $H_1$ to the top of the stress material feature 710, as shown in FIG. 7. The stress imbalance described above may be controlled to achieve a predetermined difference between the lower portion of the ALD layer 650 and the upper portion of the stress material feature 710. That is, the gradient from $W_3$ to $W_4$ may be controlled.

Figure 8:
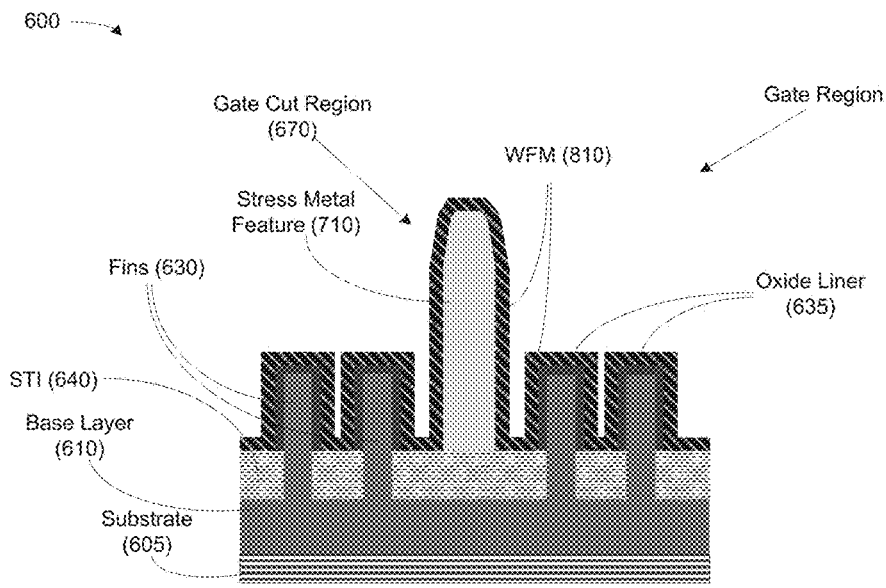
FIG. 8 illustrates a stylized cross-sectional depiction of finFET device with respect to a WFM layer deposition process, in accordance with a first embodiment.
Figure 9:
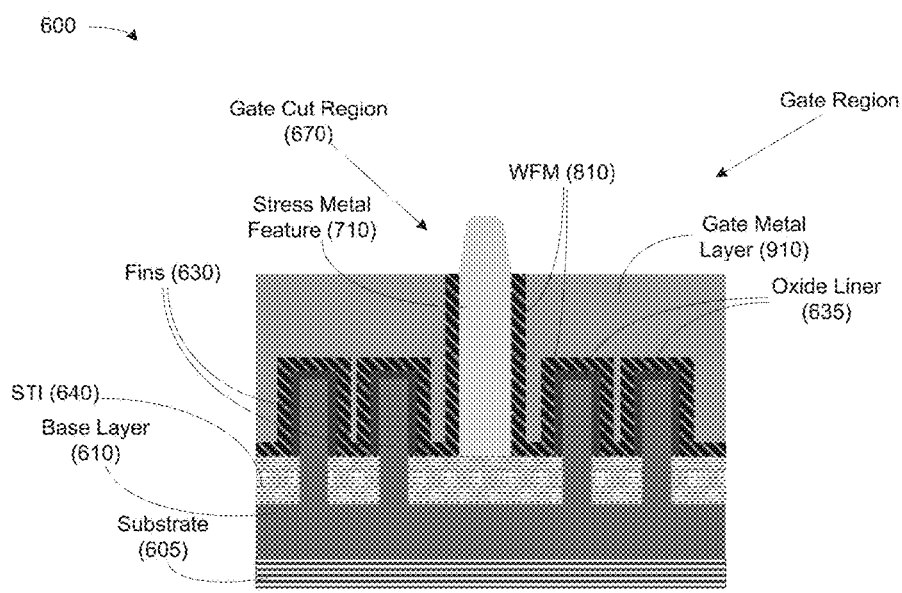
FIG. 9 illustrates a stylized cross-sectional depiction of finFET device with respect to a gate metal deposition process, in accordance with a first embodiment.

FIGS. 8-9 illustrate process steps associated with performing an RMG process in accordance with one embodiment. In an alternative embodiment, the RMG process may also include a poly pull process, as exemplified in FIG. 7.

Turning now to FIG. 8, a stylized cross-sectional depiction of finFET device with respect to a WFM layer deposition process, in accordance with a first embodiment, is illustrated. After the dummy gate material is removed, a work function metal (WFM) layer 810 is deposited in the gate region. The WFM layer 810 is a relatively thin layer that is deposited onto the fins 630, the stress metal feature 710, and between the fins 630 in the gate region.

The WFM layer 810 may comprise a first type of metal if the device 600 is a PFET devices and a second type of metal if the device 600 is an NFET device. In general, two types of work function metals may be used in processing of finFET devices: a first WFM for p-channel devices and a second WFM for n-channel devices. Generally, for affecting voltage thresholds, a large effective work function, which may indicate a large barrier height to an NFET device, is applied to PFET devices. In contrast, generally, for affecting voltage thresholds, a small effective work function, which may indicate a large barrier height to a PFET device, is applied to NFET devices. The term "polarity" with regard to WFM generally refers to the type of effective WFM used for PFET devices versus the type of effective WFM used for NFET devices, since PFET and NFET are generally considered to be of opposite polarities. The effective WFM, and hence the WFM polarity, may be affected by one or more processes, such as doping process, alloying process, annealing process, ion implantation process, etc.

Turning now to FIG. 9, a stylized cross-sectional depiction of finFET device with respect to a gate metal deposition process, in accordance with a first embodiment, is illustrated. Subsequent to depositing the WFM layer 810, a gate metal may be deposited over the WFM layer 810, forming a gate metal layer 910 in the gate region. In one embodiment, the gate metal material may be tungsten. A gate recess process that comprises an etch process and a chemical-mechanical polishing (CMP) process may be performed. These processes reduce the height of the WFM layer 810 and the gate metal layer 910 to a predetermined height, e.g., height $H_1$. As shown in FIG. 9, as a result of the shape of the ILD feature 650 (i.e., the gradual reduction of the width, $W_3$ to $W_4$ starting at height $H_1$), after the gate recess process, the residual metal/stringers described above may be more easily/efficiently removed. In some embodiments, the larger opening at the gate cut region (i.e., the narrower ILD feature 650) provides for more efficient removal of residual metal/stringers. Further processing may then be performed to complete manufacturing the device 600.

Figure 10:
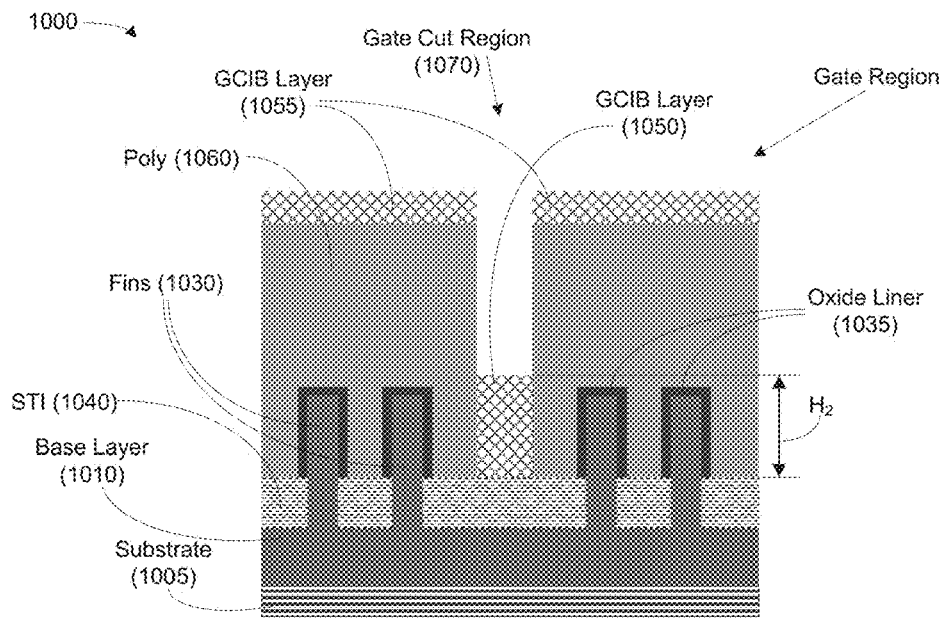
FIG. 10 illustrates a stylized cross-sectional depiction of a finFET device with respect to depositing a GCIB layer into a gate cut region, in accordance with a second embodiment.

Turning now to FIG. 10, a stylized cross-sectional depiction of a finFET device with respect to depositing a GCIB layer into a gate cut region, in accordance with a second embodiment, is illustrated. Similar to the device of FIG. 6, a device 1000 shown in FIG. 10 comprises a substrate layer 1005 (e.g., silicon substrate, silicon germanium substrate, etc.) on which a base layer 1010 is formed. In some embodiments, the substrate layer 1005 and the base layer 1010 may be a single layer. Using one of various techniques known to those skilled in the art, a plurality of fins 1030 are formed on the base layer 1010. Each of the fins 1030 may be part of a fin structure, which may include the fin 1030 and a plurality of layers of materials that may be deposited on the fins 1030.

An STI layer 1040 may be formed over the base layer 1005, up to a predetermined height of the fins 1030. The exposed portions of the fins 1030 above the STI layer 1040 are lined with an oxide liner 1035. Some of the fins 1030 may be PFET fins, while others may be NFET fins.

As shown in FIG. 10, poly gate regions 1060 are formed over the fins 1030 by depositing a dummy poly gate material, e.g., polysilicon material. In a predetermined location, a gate cut region 1070 is formed between portions of the poly gate region 1060.

In order to protect the gate region during trench silicide (TS) formation processes, the gate cut region 1070 may be filled with materials to shield the gate cut region 1070 from TS processes. In the embodiment of FIG. 10, two materials that are deposited into the gate cut region 1070 in a configuration that provides the desired stress near the top of the gate region.

Up to a predetermined height (e.g., $H_2$) in the gate cut region 1070, a dielectric material (e.g., a nitride material) is deposited using for example, a gas cluster ion beam (GCIB) process. This deposition of the GCIB material partially fills the gate cut region 1070 with a GCIB layer 1050, as shown in FIG. 10. The use of the GCIB process may provide for a relatively controlled deposition of dielectric material to a predetermined height into the gate cut region 1070. The GCIB process also results in a layer of GCIB material (i.e., GCIB layer 1055) being formed atop the poly gate layer 1060.

Figure 11:
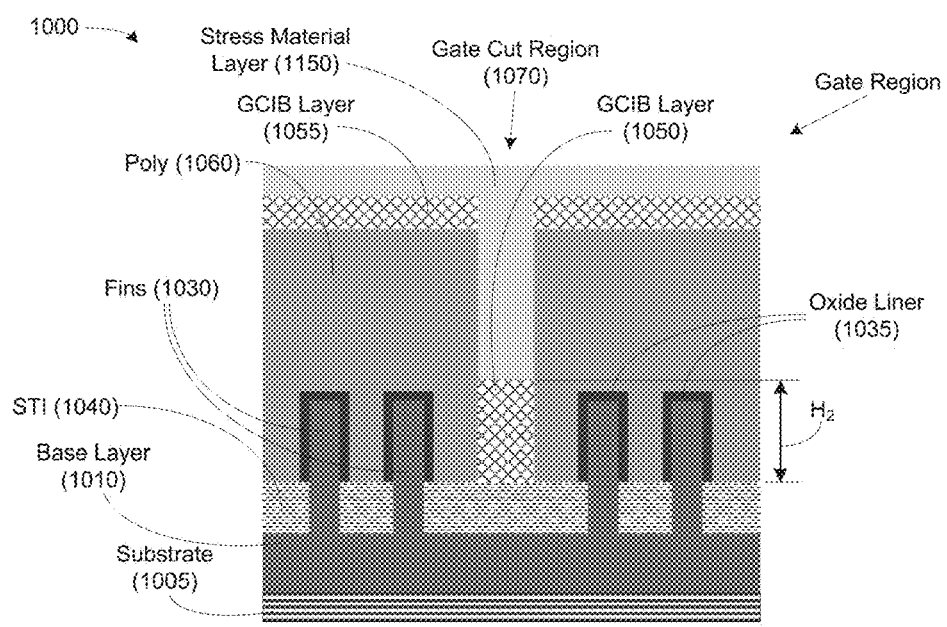
FIG. 11 illustrates a stylized cross-sectional depiction of the finFET device of FIG. 10, with respect to depositing a stress dielectric material into a gate cut region in accordance with a second embodiment.

Turning now to FIG. 11, a stylized cross-sectional depiction of the finFET device of FIG. 10, with respect to depositing a stress dielectric material into a gate cut region in accordance with a second embodiment, is illustrated. A dielectric material having an intrinsic stress is deposited onto the device 1000, forming a stress material layer 1150. The dielectric material may be a nitride material, e.g., $SiNi_2$. The stress material layer 1150 may be formed within the remaining portion of the gate cut region 1070 above the GCIB layer 1050, i.e., above the height, $H_1$, as well as atop the GCIB layer 1055.

The deposition of the stress material layer 1150 may be performed using various processes, such as a plasma-enhanced chemical vapor deposition (PECVD) process or an ALD process. The stress material layer 1150 comprises an intrinsic stress. In one embodiment, the stress may be greater than 10 MP. In one embodiment, the stress may be compressive stress, while in other embodiments, the stress may be tensile stress.

Figure 12:
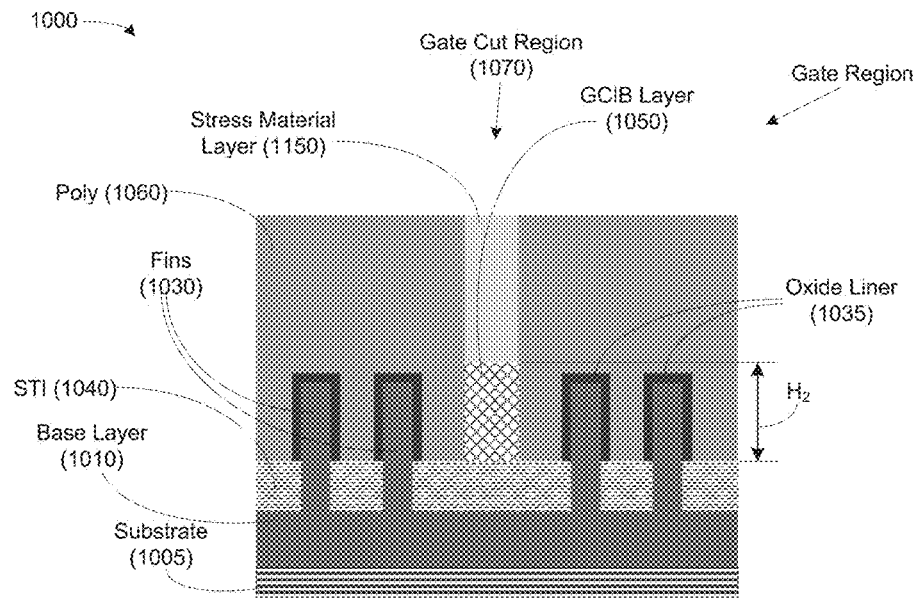
FIG. 12 illustrates a stylized cross-sectional depiction of the finFET device of FIG. 10, with respect to a CMP process in accordance with a second embodiment.

Turning now to FIG. 12, a stylized cross-sectional depiction of the finFET device of FIG. 10, with respect to a CMP process in accordance with a second embodiment, is illustrated. Upon depositing the stress material layer 1150, a chemical-mechanical polishing (CMP) process may be performed to polish the layer 1150. Upon performing the CMP process, the stress material layer 1150 is polished away from the poly gate region 1060 and is confined to the gate cut region 1070. Further, the CMP process substantially polishes away the GCIB layer 1055 over the poly gate region 1060.

Upon performing the CMP process, from the height, $H_2$ to the top portion of the poly gate region 1060, the dielectric stress layer 1150 fills the gate cut region 1070. Therefore, at this juncture of processing, the gate cut region 1070 is filled with a GCIB layer 1050 up to a predetermined height (e.g., height $H_2$), and the remaining portion of the gate cut region 1070 is filled with the stress material layer 1150.

Due to the presence of the poly gate material 1060, the stress from the dielectric stress layer 1150 is substantially balanced. Removing the poly gate material 1060 would provide a desirable imbalance resulting from the stress provided by the stress material layer 1150. This imbalance may be controlled, providing control over the shape of the top portion of the gate area, which may be helpful in reducing the metal residue described herein.

Figure 13:
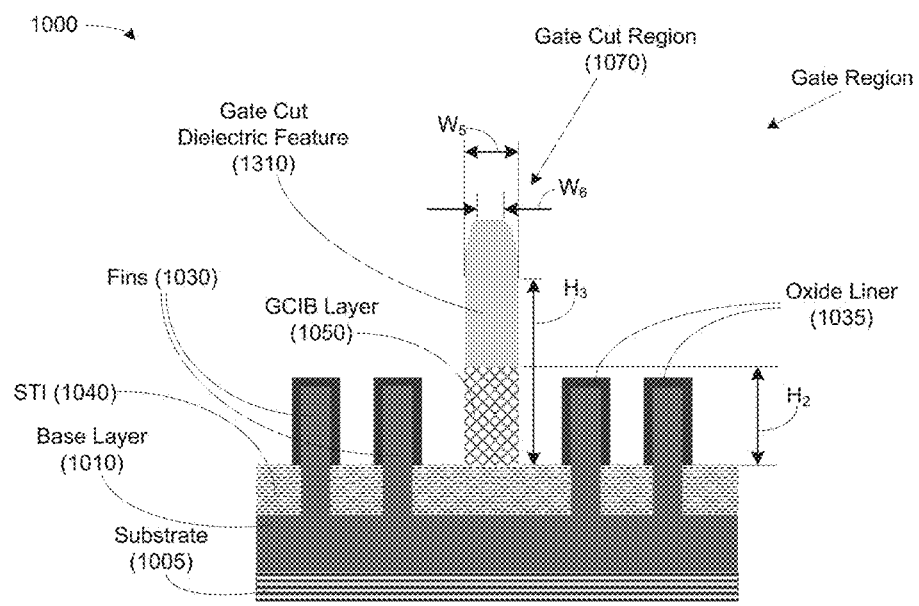
FIG. 13 illustrates a stylized cross-sectional depiction of the finFET device of FIG. 10, with respect to a poly pull process in accordance with a second embodiment.

Turning now to FIG. 13, a stylized cross-sectional depiction of the finFET device of FIG. 10, with respect to a poly pull process in accordance with a second embodiment, is illustrated. Subsequent to performing TS formation processes, the ALD material 1060 is removed from the gate regions. A poly pull process is performed to remove the poly gate material from the poly gate portion 1040, as known to those skilled in the art. This leaves voids at the areas that were formerly occupied by the poly gate portions 1040, and a gate cut dielectric feature 1310, which comprises the GCIB layer 1050 and the remaining portion of the stress material layer 1150.

Subsequent to performing the poly pull process, a stress of the material in the dielectric stress layer 1050 may cause a shape change in the manner shown in FIG. 13. As the balance of stress provided by the dielectric stress layer 1050 is disturbed due to absence of the poly pull process, the dielectric stress layer 1050 portion of the gate cut dielectric feature 1310 experiences a net stress. As a result of this stress imbalance, the width of the top portions of the gate cut dielectric feature 1310 may become progressively narrower as compared to a lower portion of the gate cut dielectric feature 1310. The width ($W_5$) at a lower portion (at height, $H_3$) of the gate cut region 1070 may be greater than the width ($W_6$) at the top portion of the gate cut dielectric feature 1310. In one embodiment, the width of the gate cut dielectric feature 1310 may change from $W_3$ to $W_4$ in a linear fashion from the height, $H_3$ to the top of the gate cut dielectric feature 1310, as shown in FIG. 13. The stress imbalance described above may be controlled to achieve a predetermined difference between the lower portion of the gate cut dielectric feature 1310 and the upper portion of the gate cut dielectric feature 1310. That is, the gradient from $W_3$ to $W_4$ may be controlled.

Subsequently, a WFM layer may be deposited, similar in the manner described in FIG. 8 and accompanying description above. Further, upon performing the WFM layer deposition, a gate metal layer may be deposited over the WFM layer, similar in manner to the process described with respect to FIG. 9 and accompanying description above.

As shown in FIG. 13, as a result of the shape of the dielectric stress layer 1050 (i.e., the gradual reduction of the width, $W_5$ to $W_6$ starting at height $H_3$ and going to the top of the gate cut region 1070), after the gate recess process, the residual metal/stringers described above may be more easily/efficiently removed. In some embodiments, the larger opening at the gate cut region (i.e., the narrower dielectric stress layer 1050) provides for more efficient removal of residual metal/stringers. Further processing may then be performed to complete manufacturing the device 1000.

Figure 14:
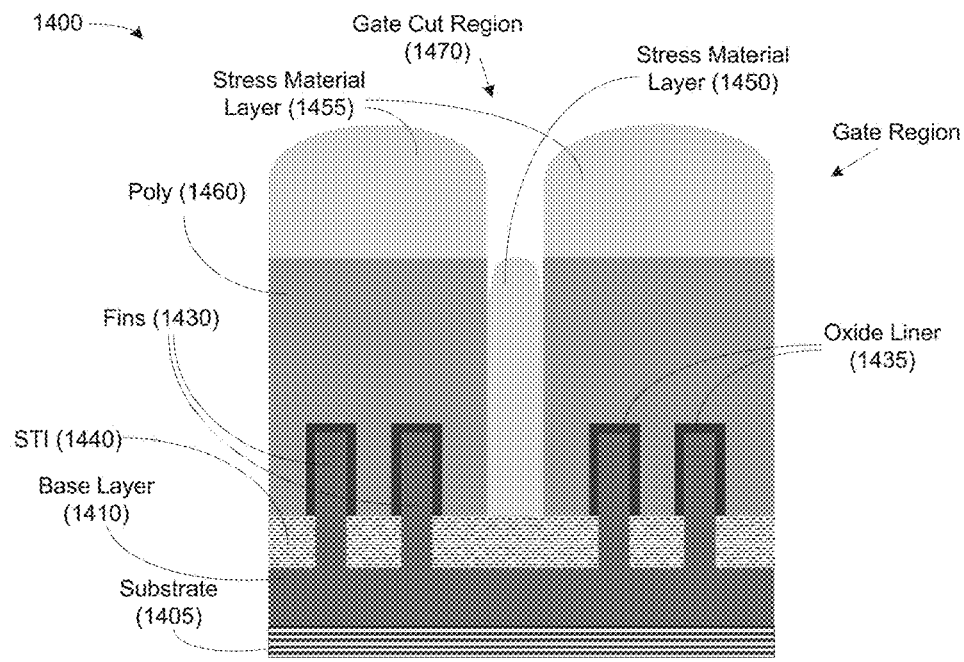
FIG. 14 illustrates a stylized cross-sectional depiction of a finFET device with respect to depositing a PECVD stress layer, in accordance with a third embodiment.

Turning now to FIG. 14, a stylized cross-sectional depiction of a finFET device with respect to depositing a PECVD stress layer, in accordance with a third embodiment, is illustrated. Similar to the device of FIG. 6, a device 1400 shown in FIG. 14 comprises a substrate layer 1405 (e.g., silicon substrate, silicon germanium substrate, etc.) on which a base layer 1410 is formed. In some embodiments, the substrate layer 1405 and the base layer 1410 may be a single layer. Using one of various techniques known to those skilled in the art, a plurality of fins 1430 are formed on the base layer 1410. Each of the fins 1430 may be part of a fin structure, which may include the fin 1430 and a plurality of layers of materials that may be deposited on the fins 1430.

An STI layer 1440 may be formed over the base layer 1405, up to a predetermined height of the fins 1430. The exposed portions of the fins 1430 above the STI layer 1440 are lined with an oxide liner 1435. Some of the fins 1430 may be PFET fins, while others may be NFET fins.

As shown in FIG. 14, poly gate regions 1460 are formed over the fins 1430 by depositing a dummy poly gate material, e.g., polysilicon material. In a predetermined location, a gate cut region 1470 is formed between portions of the poly gate region 1460.

As described above, in order to protect the gate region during other processes, e.g., TS formation processes, the gate cut region 1470 may be filled with materials to shield the gate cut region 1470 from TS processes. In the embodiment of FIG. 14, a PECVD process may be performed to deposit a stress material into the gate cut region 1470 in a configuration that provides the desired stress near the top of the gate region, as described above.

A dielectric material (e.g., a nitride material) having an intrinsic stress is deposited using a PECVD process. This deposition fills the gate cut region 1470 with a layer of stress material 1450, wherein the top portion of the layer 1450 is formed in a curved shape as exemplified in FIG. 14. The PECVD process also results in a layer of stress material 1455 being formed atop the poly gate layer 1460 in a curved shape, as depicted in FIG. 14. The stress material layer 1450 comprises an intrinsic stress. In one embodiment, the stress may be greater than 14 MP. In one embodiment, the stress may be compressive stress, while in other embodiments, the stress may be tensile stress.

Figure 15:
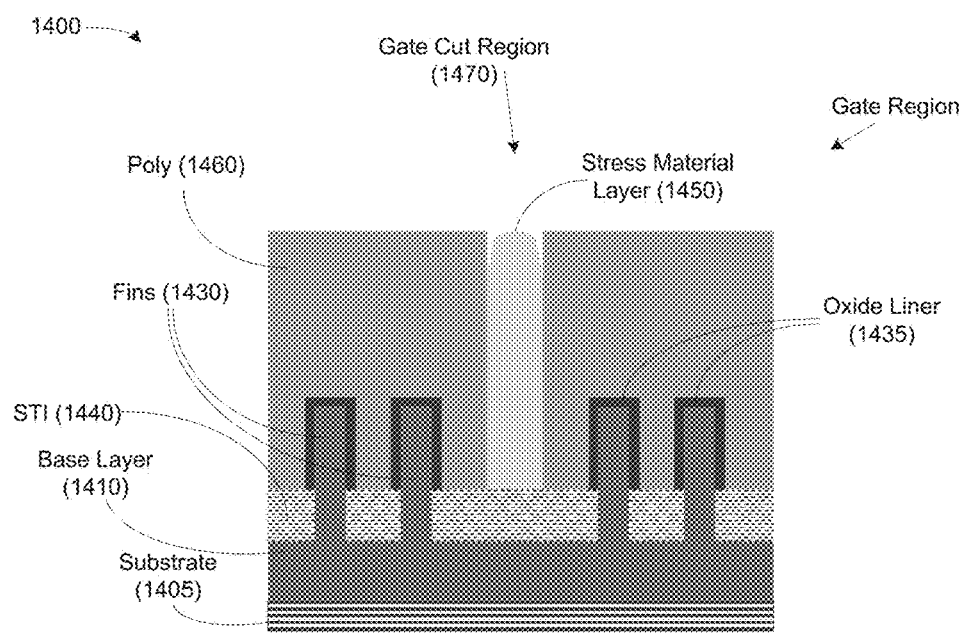
FIG. 15 illustrates a stylized cross-sectional depiction of the finFET device of FIG. 14, with respect to a CMP process in accordance with a third embodiment.

Turning now to FIG. 15, a stylized cross-sectional depiction of the finFET device of FIG. 14, with respect to a CMP process in accordance with a third embodiment, is illustrated. Upon depositing the stress material layer 1450, a chemical-mechanical polishing (CMP) process may be performed to polish the layers 1450, 1455. Upon performing the CMP process, the stress material layer 1455 is polished away from the poly gate region 1460, leaving the dielectric stress layer 1450 confined in the gate cut region 1470.

Due to the presence of the poly gate material 1460, the stress from the dielectric stress layer 1450 is substantially balanced. Removing the poly gate material 1460 would provide a desirable imbalance resulting from the stress provided by the stress material layer 1450. This imbalance may be controlled, providing control over the shape of the top portion of the gate area, which may be helpful in reducing the metal residue described herein.

Figure 16:
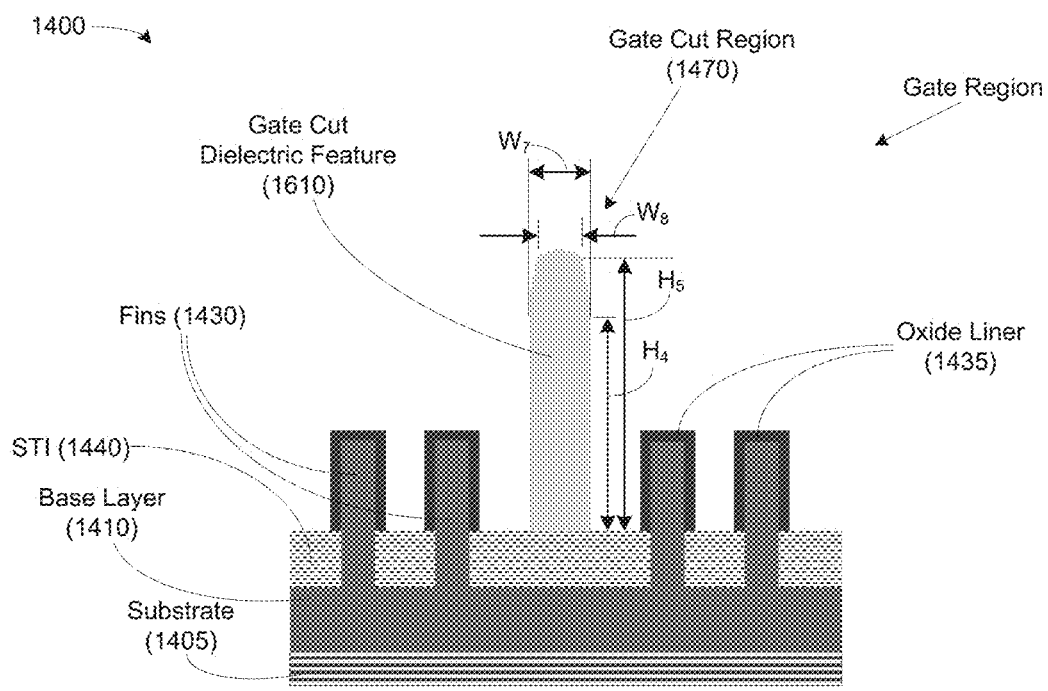
FIG. 16 illustrates a stylized cross-sectional depiction of the finFET device of FIG. 14, with respect to a poly pull process in accordance with a third embodiment.

Turning now to FIG. 16, a stylized cross-sectional depiction of the finFET device of FIG. 14, with respect to a poly pull process in accordance with a third embodiment, is illustrated. Subsequent to performing TS formation processes, the ALD material 1460 is removed from the gate regions. A poly pull process is performed to remove the poly gate material from the poly gate portion 1440, as known to those skilled in the art. This leaves voids at the areas that were formerly occupied by the poly gate portions 1440, as well as a gate cut dielectric feature 1610.

Subsequent to performing the poly pull process, a stress of the material in the gate cut dielectric feature 1610 may cause a shape change in the manner shown in FIG. 16. As the balance of stress provided by the dielectric stress layer 1450 is disturbed due to absence of the poly pull process, the gate cut dielectric feature 1610 experiences a net stress.

As a result of this stress imbalance, the width of the top portions of the gate cut dielectric feature 1610 may become progressively narrower as compared to a lower portion of the gate cut dielectric feature 1610. The difference between the width ($W_7$) at a lower portion (at height, $H_4$) of the gate cut region 1470 may be greater than the width ($W_8$) at a height, $H_5$ of the gate cut dielectric feature 1610. In one embodiment, the width of the gate cut dielectric feature 1610 may change from $W_7$ to $W_8$ at a non-linear fashion (e.g., an curved transition) on at least a portion of the feature 1610 from the height, $H_4$ to the height, $H_5$ of the gate cut dielectric feature 1610, and curving up to the top of the gate region, as shown in FIG. 16. The stress imbalance described above may be controlled to achieve a predetermined difference between the lower portion of the gate cut dielectric feature 1610 and the upper portion of the gate cut dielectric feature 1610. That is, the change from $W_7$ to $W_8$ may be controlled.

Subsequently, a WFM layer may be deposited, similar in the manner described in FIG. 8 and accompanying description above. Further, upon performing the WFM layer deposition, a gate metal layer may be deposited over the WFM layer, similar in manner to the process described with respect to FIGS. 8-9 and accompanying description above.

As shown in FIG. 16, as a result of the shape of the gate cut dielectric feature 1610 (i.e., the gradual reduction of the width, $W_7$ to $W_8$ starting at height $H_4$ and going to the height $H_5$, and onto the top of the gate cut region 1470), after the gate recess process the residual metal/stringers described above may be more easily/efficiently removed. In some embodiments, the larger opening at the gate cut region (i.e., the gate cut dielectric feature 1610) provides for more efficient removal of residual metal/stringers. The residual metal/stringers may be performed using an etch process. Further processing may then be performed to complete manufacturing the device 1400.

Figure 17:
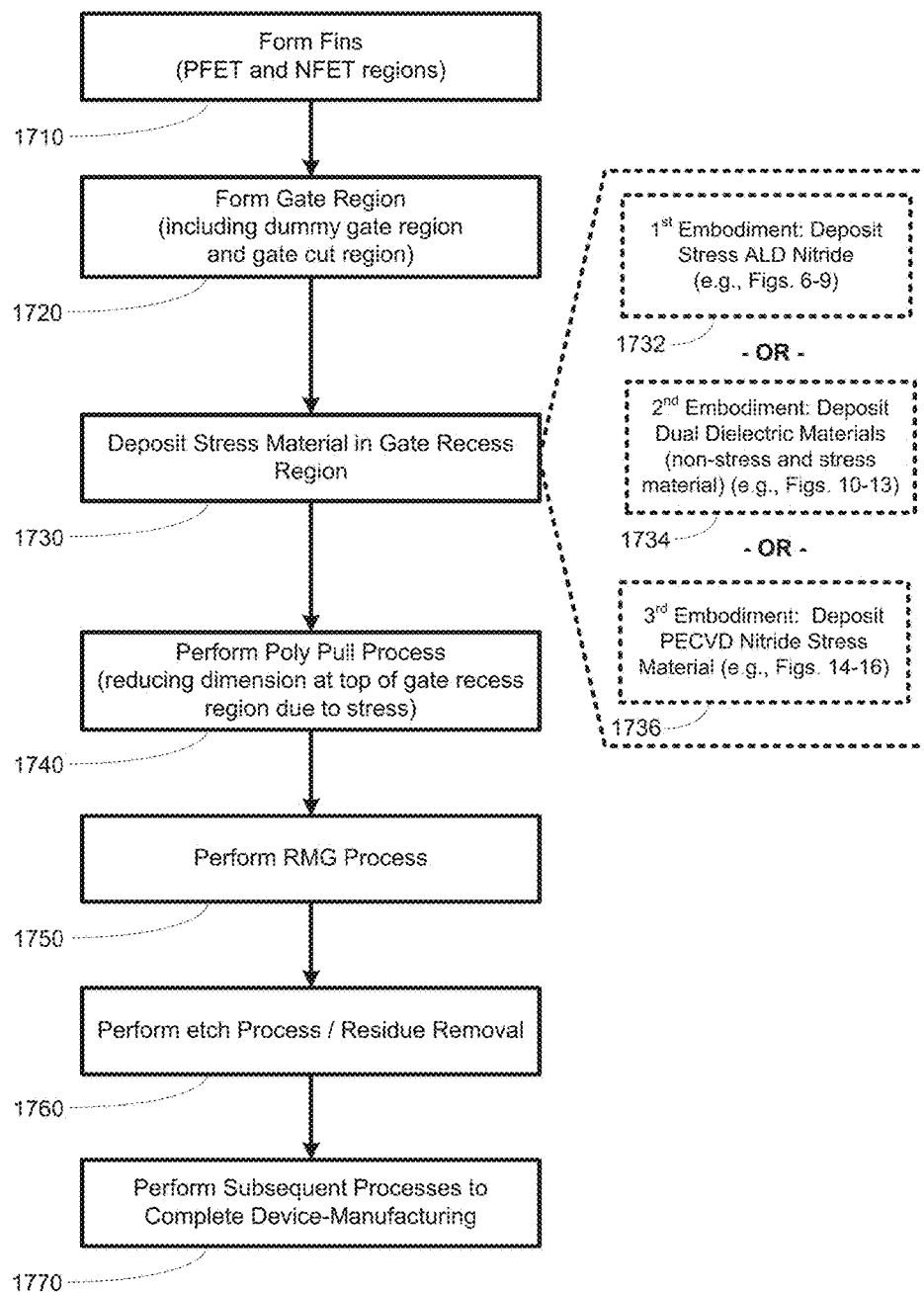
FIG. 17 illustrates a flowchart depiction of the method for processing an EPI feature for forming a gate cut process involving a stress material, in accordance with embodiments herein.

Turning now to FIG. 17, a flowchart depiction of the method for processing an EPI feature for forming a gate cut process involving a stress material, in accordance with embodiments herein is illustrated. A plurality of fins on a semiconductor device, wherein the fins are formed on a base layer over a substrate, including PFET and NFET fins (at 1710). One or more gate regions are formed over a portion of the fins (at 1720). Forming the gate regions comprises forming a poly gate (dummy) gate region. Further, forming the gate regions also comprises forming a gate cut or gate recess region within the gate regions.

Subsequently, a stress material having an intrinsic stress may be deposited in the gate cut region (at 1730). In a first embodiment, the stress material may be filled into the gate cut region in the form of an ALD material (e.g., ALD nitride material) having an intrinsic stress (at 1732), as exemplified in FIG. 6.

In a second embodiment, a two-part deposition may be performed (at 1734). In this embodiment, a dielectric material may be deposited up to a predetermined height in the gate cut region (at 1734), as exemplified in FIG. 10. The deposition of the dielectric material may be performed using a GCIB process. Above the predetermined height, a dielectric material having an intrinsic stress is deposited into the remaining portion of the gate cut region, as exemplified in FIG. 11.

In a third embodiment, a stress material having an intrinsic stress may be deposited into the gate cut region using a PECVD (at 1736), forming a PECVD stress layer, as exemplified in FIG. 14. This deposition fills the gate cut region with a layer of stress material, wherein the top portion of the layer 1450 is formed in a curved shape as exemplified in FIG. 14. A CMP process may be performed to confine the stress material within the gate cut region. The stress resulting from utilizing the stress material may be tensile stress, or in other embodiment, compressive stress.

A poly pull process may the performed (at 1740). Due to the presence of the poly gate material 1460, the stress from the dielectric stress layer 1450 is substantially balanced. Removing the poly gate material 1460 would provide a desirable imbalance resulting from the stress provided by the stress material layer 1450. This imbalance may be controlled, providing control over the shape of the top portion of the gate area, which may be helpful in reducing the metal residue described herein. The dimension at the top of the gate region may be altered such that material residue is reduced or even substantially eliminated.

An RMG process may then be performed (at 1750). In one embodiment, the RMG process may comprise depositing a WFM layer over said fins in the gate region and depositing a gate metal material, e.g., tungsten, above the WFM layer. In other embodiments, the RMG process may also include performing the poly pull process described at block 1740. Further, a process (e.g., RIE process) that is capable of substantially removing residue about the gate cut region may be performed, substantially removing any residual metal or stringers left at the top portion of the gate cut region (at 1760). Further, subsequent processes known to those skilled in the art for completing manufacturing of the semiconductor device (at 1770).

Figure 18:
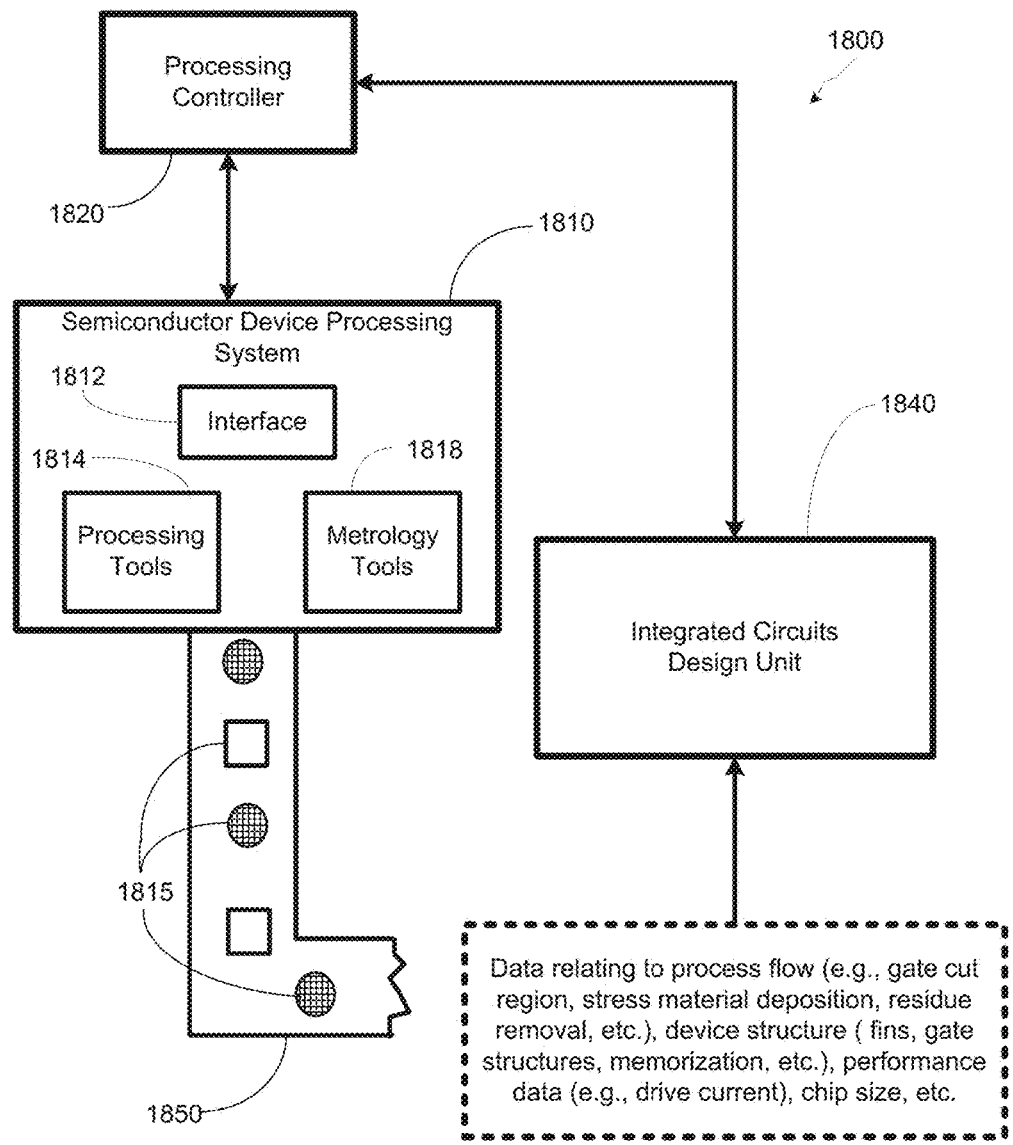
FIG. 18 illustrates a stylized depiction of a system for fabricating a semiconductor device comprising an integrated circuit, in accordance with embodiments herein.

Turning now to FIG. 18, a stylized depiction of a system for fabricating a semiconductor device comprising an integrated circuit, in accordance with embodiments herein, is illustrated. The system 1800 provides for depositing a stress material into a gate cut region for reducing residue material and stringers. The system 1800 of FIG. 18 may comprise a semiconductor device processing system 1810 and a design unit 1840. The semiconductor device processing system 1810 may manufacture integrated circuit devices based upon one or more designs provided by the design unit 1840.

The semiconductor device processing system 1810 may comprise various processing stations, such as deposition (e.g., ALD, PECVD, etc.) stations, etch process stations, photolithography process stations, CMP process stations, etc. One or more of the processing steps performed by the processing system 1810 may be controlled by the processing controller 1820. The processing controller 1820 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1810 may produce integrated circuits on a medium, such as silicon wafers. More particularly, the semiconductor device processing system 1810 produce integrated circuits having finFET devices that comprise fins that have channel voids filled with oxide and performed in a manner to reduce or substantially prevent oxidization, as described above.

The production of integrated circuits by the device processing system 1810 may be based upon the circuit designs provided by the integrated circuits design unit 1840. The processing system 1810 may provide processed integrated circuits/devices 1815 on a transport mechanism 1850, such as a conveyor system. In some embodiments, the conveyor system may be sophisticated clean room transport systems that are capable of transporting semiconductor wafers. In one embodiment, the semiconductor device processing system 1810 may comprise a plurality of processing steps to perform deposition of material comprising intrinsic stress into gate cut regions.

In some embodiments, the items labeled "1815" may represent individual wafers, and in other embodiments, the items 1815 may represent a group of semiconductor wafers, e.g., a "lot" of semiconductor wafers. The integrated circuit or device 1815 may be a transistor, a capacitor, a resistor, a memory cell, a processor, and/or the like.

The integrated circuit design unit 1840 of the system 1800 is capable of providing a circuit design that may be manufactured by the semiconductor processing system 1810. The integrated circuit design unit 1840 may be capable of determining the number of devices (e.g., processors, memory devices, etc.) to place in a device package, stress material to be deposited into the gate cut regions, etc. The integrated circuit design unit 1840 may also determine the type of stress materials to be deposited, the height of the deposition of non-stress materials and/or stress materials to be deposited into gate cut regions, the height of the fins, the size of the fin channels, etc. Based upon such details of the devices, the integrated circuit design unit 1840 may determine specifications of the finFETs that are to be manufactured. Based upon these specifications, the integrated circuit design unit 1840 may provide data for manufacturing a semiconductor device having the EPI features provided by embodiments herein.

The system 1800 may be capable of performing analysis and manufacturing of various products involving various technologies. For example, the system 1800 may design and production data for manufacturing devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
forming a set of fins on a semiconductor substrate;
forming a gate region above a portion of said set of fins;
forming a gate cut trench within said gate region;
depositing a dielectric material comprising an intrinsic stress into said gate cut trench;
performing a replacement metal gate process in said gate region; and
removing residue metal features about said gate cut trench.

2. The method of claim 1, wherein forming said gate region comprises:
forming an oxide liner for lining said portion of said set of fins above a shallow trench isolation layer; and
forming a poly silicon layer above said oxide liner in said gate region.

3. The method of claim 2, wherein depositing a dielectric material comprises:
depositing a silicon nitride layer having an intrinsic stress into said gate cut trench; and
performing a chemical-mechanical polishing process on said poly silicon layer and said silicon nitride layer to a predetermined height.

4. The method of claim 1, wherein depositing the dielectric material comprising one of:
depositing a dielectric material having an intrinsic tensile stress; or
depositing a dielectric material having an intrinsic compressive stress.

5. The method of claim 1, wherein depositing said dielectric material comprises:
depositing a first dielectric layer having substantially no intrinsic stress into said gate cut trench up to a first height in said gate cut trench; and
depositing a second dielectric layer having an intrinsic stress into the gate cut trench from said first height to a top portion of the gate region.

6. The method of claim 5, wherein depositing said first dielectric layer comprises depositing a nitride material.

7. The method of claim 5, wherein:
depositing said first dielectric layer comprises performing a gas cluster ion beam (GCIB) process for depositing the first dielectric layer; and
depositing said second dielectric layer comprises performing one of:
a plasma-enhanced chemical vapor deposition (PECVD) process; or
an atomic layer deposition (ALD) process for depositing said second dielectric layer.

8. The method of claim 1, wherein depositing the dielectric material comprises one of:
performing a plasma-enhanced chemical vapor deposition (PECVD) process for depositing said dielectric material; or
performing an atomic layer deposition (ALD) process.

9. The method of claim 1, wherein:
forming said gate region comprises depositing a poly silicon material over said portion of said set of fin; and
forming said gate cut trench comprises removing a portion of the poly silicon material to form a void in said poly silicon material.

10. The method of claim 9, wherein performing said replacement metal gate process in said gate region comprises:
performing a poly pull process for removing said poly silicon material, leaving a stress material feature that comprises a first width equal to the width of said gate cut trench at a first height, and a second width at a top region of said stress material feature, wherein said second width is less than said first width;
depositing a work function metal layer over said portion of said set of fins in said gate region; and
depositing a conductive metal layer over said work function metal layer.

11. A method comprising:
forming a set of fins on a semiconductor substrate;
forming a gate region above a portion of said set of fins by depositing a poly silicon material over said portion of said set of fins;
forming a gate cut trench in said gate region by removing a portion of said poly silicon material, wherein said gate cut trench having a first width;
depositing a dielectric material having a predetermined amount of stress into said gate cut trench;
removing said polysilicon material, leaving a dielectric stress material feature having a first width at a first height and a second width at a top portion of said dielectric stress material feature;
performing a replacement metal gate process in said gate region; and
removing residue metal features adjacent said dielectric stress material feature.

12. The method of claim 11, wherein depositing said dielectric stress material feature comprises one of:
depositing a dielectric material having an intrinsic tensile stress; or
depositing a dielectric material having an intrinsic compressive stress.

13. The method of claim 12, wherein depositing said dielectric stress material feature comprises:
depositing a first dielectric layer having substantially no intrinsic stress into said gate cut trench up to said first height in said gate cut region; and
depositing a second dielectric layer having an intrinsic stress into said gate cut trench from said first height to a top portion of the gate region.

14. The method of claim 13, wherein
depositing said first dielectric layer comprises performing a gas cluster ion beam (GCIB) process for depositing the first dielectric layer; and
depositing said second dielectric layer comprises performing at least one of a plasma-enhanced chemical vapor deposition (PECVD) process or an atomic layer deposition (ALD) process for depositing said second dielectric layer.

15. The method of claim 12, wherein:
performing the replacement metal gate process comprises depositing a work function metal layer over said portion of said set of fins in said gate region; and
removing residue metal features adjacent said dielectric stress material feature comprises performing an etch process for removing said residue metal features.

16. A system, comprising:
a semiconductor device processing system to manufacture a semiconductor device comprising at least one fin field effect transistor (finFET); and
a processing controller operatively coupled to said semiconductor device processing system, said processing controller configured to control an operation of said semiconductor device processing system;

wherein said semiconductor device processing system is adapted to:
- form a set of fins on a semiconductor substrate;
- form a gate region above a portion of said set of fins;
- form a gate cut trench in said gate region;
- deposit a dielectric material comprising an intrinsic stress into said gate cut trench;
- perform a replacement metal gate process in said gate region; and
- remove a residue metal feature adjacent said gate cut trench.

17. The system of claim 16, further comprising a design unit configured to generate a first design comprising a definition for a process mask and a definition for forming said gate cut trench and depositing said dielectric material, wherein data from said design unit is used by said processing controller to control an operation of said semiconductor device processing system.

18. The system of claim 17, wherein intrinsic stress is one of a tensile stress or a compressive stress.

19. The system of claim 18, wherein said semiconductor device processing system is adapted to:
- deposit, using a gas cluster ion beam (GCIB) process, a first dielectric layer having substantially no intrinsic stress into said gate cut trench up to a first height in said gate cut trench; and
- depositing a second dielectric layer having an intrinsic stress into the gate cut trench from said first height to a top portion of the gate region using at least one of a plasma-enhanced chemical vapor deposition (PECVD) process or an ALD process.

20. The system of claim 16, wherein said semiconductor device processing system is adapted to:
- perform a poly pull process for removing a poly silicon material, leaving a stress material layer that comprises a first width equal to the width of said gate cut trench at a first height, and a second width at a top region of said stress material layer, wherein said second width is less than said first width;
- deposit a work function metal layer over said portion of said set of fins in said gate region; and
- deposit a conductive metal layer over said work function metal layer.

* * * * *